Nov. 11, 1958 E. A. TAFT, JR., ET AL 2,860,219

SILICON CURRENT CONTROLLING DEVICES

Filed Sept. 7, 1954

Inventors:
Ernest A. Taft Jr.
Fordyce H. Horn,
by Paul A. Frank
Their Attorney.

2,860,219
Patented Nov. 11, 1958

2,860,219

SILICON CURRENT CONTROLLING DEVICES

Ernest A. Taft, Jr., Schenectady, and Fordyce H. Horn, Scotia, N. Y., assignors to General Electric Company, a corporation of New York Application September 7, 1954, Serial No. 454,574

4 Claims. (Cl. 201—63)

This invention relates to silicon electric current controlling devices and more particularly to silicon devices sensitive to heat and light.

One object of the invention is to provide silicon devices the resistivities of which are unusually thermosensitive over a range of temperatures from about —80° C. to 100° C., and yet having absolute magnitudes of resistivity over such temperature range which enable the devices conveniently to serve as thermosensitive control elements of electric circuits.'

Another object of the invention is to provide silicon devices exhibiting unusually pronounced photoconductive properties; in order words, a high degree of change in resistivity level for different intensities of impinging light, and particularly infra red light, over a large range of temperatures, particularly from —100° C. to —200° C. The absolute magnitudes of the range of resistivity change of these photosensitive silicon devices when subjected to incident light at these low temperatures, enable the devices conveniently to serve as efficient photosensitive control elements for electric circuits and especially to serve as infra-red detectors for infra-red wavelengths, for example, about 1 micron.

In general, semiconductor current controlling devices in accord with the invention are provided in the form of a high purity P-type silicon crystalline body having at least a portion thereof impregnated with a trace of gold and having a pair of spaced connections thereto. The silicon body may be impregnated by the fusion and diffusion of a gold contact within the body at an elevated temperature, for example, 1000° C., but is preferably impregnated by addition of gold to a silicon melt from which a gold impregnated crystal is grown. The term "trace of gold" is used herein to mean from $10^{13}$ to $10^{17}$ atoms of gold per cubic centimeter of silicon. The term "high purity silicon" is used herein to mean silicon having less than $2\times10^{16}$ atoms of impurities per cubic centimeter of silicon and corresponds to silicon having a resistivity above 1 ohm centimeter at 25° C. The addition of gold to the high-purity P-type silicon greatly enhances the thermoconductive and photoconductive properties of the silicon body, particularly at low temperatures and enables the provision of thermocontrol and photocontrol elements which are extremely sensitive to changes in temperature and light level.

The novel features believed characteristic of the invention are set forth in the appended claims. The invention itself, however, together with further objects and advantages thereof, may best be understood by referring to the following description taken in connection with the accompanying drawing, in which:

Figures 1, 2, 3, 4, 5:
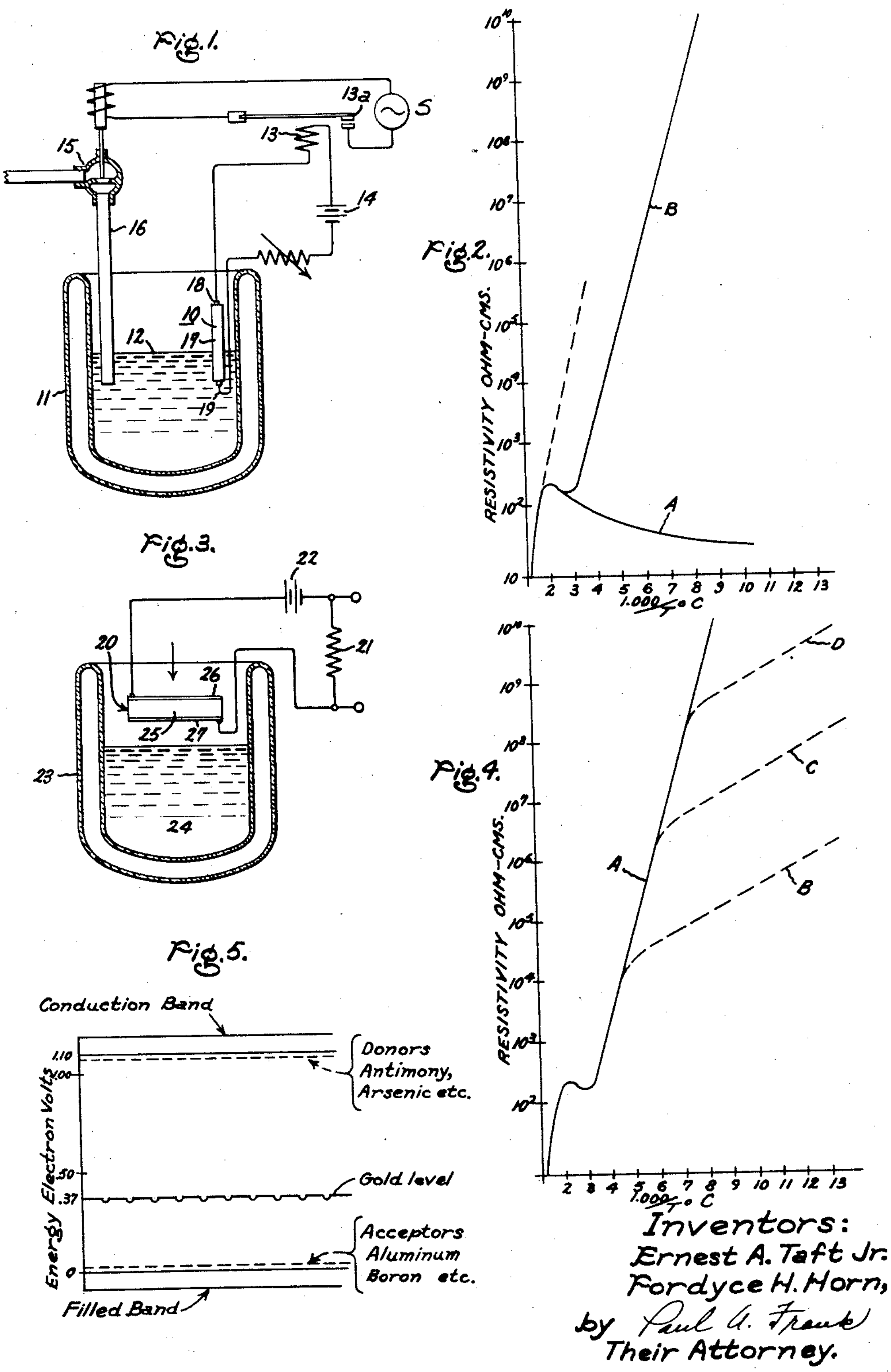
Fig. 1 illustrates a thermoconductive control device embodying the invention and an electric circuit therefor.
Fig. 2 is a group of curves illustrating the improvement in thermoconductive properties resulting from the presence of gold in the thermoconductive device of Fig. 1.
Fig. 3 illustrates a photoconductive control device embodying the invention and an electric circuit therefor.
Fig. 4 is a group of curves illustrating the photoconductive preperties of the device of Fig. 3.
Fig. 5 is an energy level diagram of silicon impregnated with certain designated impurities.

Referring to Fig. 1, the invention is shown in one form as a thermoconductive element 10 connected to a suitable circuit for measuring or monitoring the level of a liquid within an insulated vessel 11 containing a liquefied gas 12 such as liquid oxygen. Thermoconductive element 10 is connected in series with the coil of an electromagnetic switch 13 and an alternating or direct current source shown as battery 14. The contacts 13A of switch 13 are connected in series with an alternating voltage power source S and the coil of an electromagnetically controlled fluid valve 15 arranged to control the flow of liquefied gas through conduit 16 into vessel 11 by being opened when energized and closed when de-energized.

Thermoconductive element 10 comprises a high purity silicon crystalline bar 17 impregnated with a trace of gold and a pair of low resistance connections 18 and 19 to opposite ends of bar 17. Silicon bar 17 is preferably monocrystalline and may conveniently be of the order of ½ inch long and 1/16 inch wide and thick. The silicon bar 17 is preferably substantially free of all electrically significant impurities other than gold. However, acceptor impurities such as boron, indium or gallium to the extent of about $2\times10^{16}$ atoms of such impurities or less corresponding to about 1 ohm centimeter or higher resistivity silicon at 25° C. may be present before the addition of gold. The gold is incorporated in the silicon in relatively minute amounts, less than $10^{17}$ atoms of gold per cubic centimeter of silicon. The total impurity content of both gold and other significant impurities in the silicon should thus not exceed $10^{17}$ atoms of impurities per cubic centimeter of silicon.

Silicon bar 17 may be easily provided by extraction from a monocrystalline ingot grown by seed crystal withdrawal during solidification from a melt of high purity initially P-type silicon material having a solidified resistivity above 1 ohm centimeter at 25° C., to which has been added from 5 to 10% by weight of pure gold. Because of the low segregation coefficient of gold in silicon (about $3.0\times10^{-5}$), less than $10^{17}$ atoms per cubic centimeter of gold will be assimilated by the growing silicon ingot. Even additions of minute traces of gold corresponding, for example, to the presence of $10^{13}$ atoms of gold per cubic centimeter of silicon appear to have pronounced effect and enhancement of the thermoconductive properties of the silicon material.

In general, it may be stated that the greater the purity of the silicon in bar 17, the less the amount of gold that is necessary to produce the same enhancement of the thermoconductive properties. For example, only approximately 300 milligrams of gold need be added for each 100 grams of silicon having a purity corresponding to a resistivity above 30 ohm centimeters at 25° C. A silicon ingot grown by seed crystal withdrawal from this latter alloy melt will have substantially the same desirable thermoconductive properties at low temperatures as an initially less pure silicon melt impregnated with a heavier concentration.

Contacts 18 and 19 preferably comprise an acceptor activator element such as indium or aluminum which may be fused to the silicon bar 17 at about 650° C. Very low resistance connections are thus provided to thermoconductive silicon bar 17.

The enhancement of the thermoconductive properties of silicon bar 17 resulting from the impregnation thereof with gold is illustrated by the curves of Fig. 2. In Fig. 2, curve A is a plot of the resistivity versus temperature of a silicon bar extracted from a portion of an ingot grown from a melt of high purity P-type silicon before the addition of gold to the melt. Curve B, on the other hand, is a plot of the resistivity versus temperature curve of a silicon bar extracted from a portion of the same ingot grown from the same silicon melt after approximately 300 milligrams of gold were added for each 100 grams of silicon in the melt. As can be seen from these curves, the P-type silicon bar extracted from the portion grown before gold was added to the melt exhibits little change in resistivity over the temperature range from −80° C. to 100° C., while the sample extracted from the gold-impregnated portion of the ingot exhibits a very sharp increase in resistivity for decreases in temperature over this temperature range. As can be seen from the slope of curve B the resistivity of the gold impregnated silicon bar 17 varies from a few hundred ohms to 50 megohms in the temperature range from −80° C. to 100° C. This range of resistivity change lends itself admirably to the control of electric currents. By selecting a load 13 in the circuit of bar 17 having approximately the same order of resistance or impedance magnitude as that of silicon bar 17 over the range of temperatures to be measured or monitored by the thermoconductive device 10, the change in resistance of the thermoconductive device as a result of any change in temperature thereof immediately appears as a considerable change in current through the load. Devices such as thermoconductive body 17 are particularly useful, as the range of temperatures over which the thermoconductive properties are most pronounced encompasses room temperature and extends for at least 75 centigrade degrees above and below that point. Such devices, therefore, are highly thermosensitive at the temperatures at which the need for such devices is greatest. In addition, the absolute magnitude of resistivity of such devices at normal operating temperatures is easily matched in impedance-matching circuits to secure optimum power transfer. For example, referring to curve B of Fig. 2, at room temperature (25° C.), the bulk resistivity of silicon bar 17 is of the order of from 100 to 1000 ohm centimeters.

Referring now to Fig. 3, we have shown a photoconductive cell 20 embodying the invention and connected in a suitable electrical circuit comprising output resistor 21 and a battery 22. Photoconductive cell 20 is maintained at a desired low temperature by immersion within an insulated vessel 23 containing a liquefied gas 24, such as liquid air. Photoconductive cell 20 comprises a silicon crystalline wafer 25 which may conveniently be a rectangular wafer ½ inch long and wide, and about 50 mils thick. The photoconductive device 20 contains electrodes 26 and 27 covering the opposite major surfaces of the silicon wafer 25. The upper electrode 26 is in the form of a ring in order that incident light rays will reach and activate the silicon wafer 25. The lower layer 27 may be any shape desired. Both electrodes 26 and 27 may comprise metals which make non-rectifying connection to silicon wafer 25. Electrodes 26 and 27 preferably make low resistance connection and may conveniently comprise layers of an acceptor activator, preferably selected from the group consisting of indium, gallium and aluminum that are subsequently fused with the surface of the silicon wafer 25 by a suitable application of heat.

Silicon wafer 25 comprises silicon impregnated with a trace of gold within the same limits as set forth above with relation to the silicon bar 17 of thermoconductive element 10. High impurity P-type silicon containing less than $2 \times 10^{16}$ atoms of acceptor activator impurities is used as the base silicon material and this silicon material is impregnated with up to $10^{17}$ atoms of gold per cubic centimeter of the silicon. It is convenient to use silicon having an initial resistivity of above 30 ohm centimeters at 25° C. as the base silicon material and impregnate this starting material with of the order of $10^{15}$ atoms of pure gold per cubic centimeter of silicon. This may be easily done by preparing a melt of this silicon and adding from 300 to 350 milligrams of pure gold per 100 grams of silicon of the melt and then growing an ingot from this gold-impregnated melt by seed crystal withdrawal therefrom. A wafer 25 cut from this grown ingot will then have the desired degree of gold impregnation.

The extent of the photoresponse in the gold-impregnated silicon photoconductive cells 20 of Fig. 3 is illustrated in the curves of Fig. 4. The solid line A of Fig. 4 is a plot of the resistance versus temperature characteristic of cell 20 when completely in the dark. The broken lines B. C. and D which meet the solid curve A indicate different levels of resistivity to which the photoconductive cell 20 drops under impinging light of different light intensities. As can be seen from these curves, the photoconductive effect occurs from −100° C. to −200° C. and principally from about −140° C. to −200° C.

The reason for the unusual thermoconductive, photoconductive, and resistivity stabilizing effect of gold impregnated silicon crystalline bodies is believed to be an energy level scheme for silicon such as shown in Fig. 5. As illustrated in Fig. 5, the gold impregnation induces at least one donor level at about 0.37 electron volts above the filled band. This is to be contrasted with the conventional acceptor materials for silicon such as boron, or gallium, whose energy levels lie very close, less than 0.06 electron volt, to the filled band, or with the conventional donor materials for silicon such as antimony or arsenic whose energy levels lie very close, less than 0.06 electron volt, to the conduction band. The observed properties of the gold-impregnated silicon crystals may be determined by the degree to which these gold induced donor levels are emptied of electrons by the acceptor impurities. It is necessary that the silicon crystal be substantially free of other donor activator impurities, such as arsenic or antimony, because such other donor impurities tend to mask the effect of the gold due to their higher electrical activity. It is to be understood, however, that this energy level diagram is offered only for the purpose of providing a possible scientific explanation of the phenomena involved in the operation of the devices of our invention and is not to be considered to restrict the scope of the invention or to impair the validity of the claims thereto if a different explanation should ultimately prove more accurate or comprehensive.

It will also be appreciated that, although we have described specific embodiments of the invention, many modifications may be made, and we intend by the appended claims to cover all such modifications as fall within the true spirit and scope of the invention.

What we claim as new and desire to secure by Letters Patent of the United States is:

1. An electric current control device comprising a high purity p-type silicon monocrystalline body having a resistivity above 1 ohm centimeters at 25° C., said body having at least a portion thereof impregnated with $10^{13}$ to $10^{17}$ atoms of gold and a finite amount less than $10^{16}$ atoms of acceptor impurities per cubic centimeter thereof and being substantially free of all electrically significant donor impurities other than gold, and a pair of electrical connections to spaced regions of said body.

2. An electric current controlling device comprising a high purity silicon monocrystalline body having at least a portion thereof impregnated with $10^{13}$ to $10^{17}$ atoms of gold and a finite amount less than $10^{16}$ atoms of acceptor impurities per cubic centimeter thereof and substantially free of all other donor activator elements for silicon, said body exhibiting a change in resistivity from a few hundred ohm-centimeters at 100° C. to several million ohm-centimeters at −80° C., and a pair of low resistance connections to spaced regions of said body.

3. Photosensitive control apparatus comprising a body consisting essentially of high purity silicon impregnated with $10^{13}$ to $10^{17}$ atoms of gold and a finite amount less than $10^{16}$ atoms of acceptor impurities per cubic centimeter thereof and substantially free of all other electrically significant donor impurity elements for silicon, means for delivering an electric current through said body and means for maintaining said body at temperatures from −100° C. to −200° C., said gold impregnated body exhibiting a high degree of change in conductivity with changes in light intensity over said temperature range.

4. Control apparatus comprising a monocrystalline body consisting essentially of high purity silicon impregnated with $10^{13}$ to $10^{17}$ atoms of gold and a finite amount less than $10^{16}$ atoms of acceptor activator impurities per centimeter thereof, said body being substantially free of all other donor activators for silicon other than gold, means for delivering an electric current through said body and means for maintaining said body at temperatures from −100° C. to −200° C., said gold impregnated said body exhibiting a high change of conductivity with temperatures over said temperature range.

References Cited in the file of this patent

UNITED STATES PATENTS

| | | |
|---|---|---|
| 1,907,114 | Ives | May 2, 1933 |
| 2,547,173 | Rittner | Apr. 3, 1951 |
| 2,561,411 | Pfann | July 24, 1951 |
| 2,671,154 | Burstein | Mar. 2, 1954 |

OTHER REFERENCES

Electrical Engineering, December 1949, Conductivity in Semiconductors, by K. Lark-Horovitz, pp. 1047–1055.

Electrical Engineering, July 1952, The ABC's of Germanium, by J. P. Jordan, pages 619 to 625.

Fuller et al.: "Diffusion of Lithium into Germanium and Silicon," Physical Review, v. 91, No. 1, July 1, 1953; page 193 is pertinent.

Dunlap: "Acceptor States of Gold in Germanium," Physical Rev., v. 91, No. 1, July 1, 1953; p. 208 is pertinent.

Taft et al.: "Gold as a Donor in Silicon" Physical Review, vol. 93, No. 1 January 1954, page 64.